United States Patent [19]
Luisi et al.

[11] 3,990,056
[45] Nov. 2, 1976

[54] HIGH SPEED MEMORY CELL

[75] Inventors: James A. Luisi, Anaheim; Clarence W. Padgett, Fountain Valley; Dana C. Street, Placentia, all of Calif.

[73] Assignee: Rockwell International Corporation, El Segundo, Calif.

[22] Filed: Oct. 2, 1975

[21] Appl. No.: 618,982

Related U.S. Application Data

[63] Continuation-in-part of Ser. No. 513,367, Oct. 9, 1974, abandoned.

[52] U.S. Cl. .......................... 340/173 R; 307/288; 307/290; 340/173 FF
[51] Int. Cl.² ........................................ G11C 11/40
[58] Field of Search ...................... 307/288, 290; 340/173 R, 173 FF

[56] References Cited
UNITED STATES PATENTS

| | | | |
|---|---|---|---|
| 3,493,786 | 2/1970 | Ahrons | 340/173 R |
| 3,521,242 | 7/1970 | Katz | 340/173 R |
| 3,798,621 | 3/1974 | Batinger | 340/173 FF |
| 3,820,086 | 6/1974 | Ho | 307/291 |
| 3,868,656 | 2/1975 | Stein | 340/173 FF |

*Primary Examiner*—Terrell W. Fears
*Attorney, Agent, or Firm*—H. Fredrick Hamann; G. Donald Weber, Jr.; Morland Charles Fischer

[57] ABSTRACT

An improved very high speed, static random access memory cell disclosed which is comprised of complementary metal oxide semiconductor field effect transistors which may be formed by silicon on sapphire techniques. To maximize the speed of the read operation while, at the same time, decreasing the overall cell area and consequently the cost, the cell is made highly non-symmetrical in design. As an example, selected ones of the semiconductor transistors may have reduced channel widths with respect to one another.

27 Claims, 5 Drawing Figures

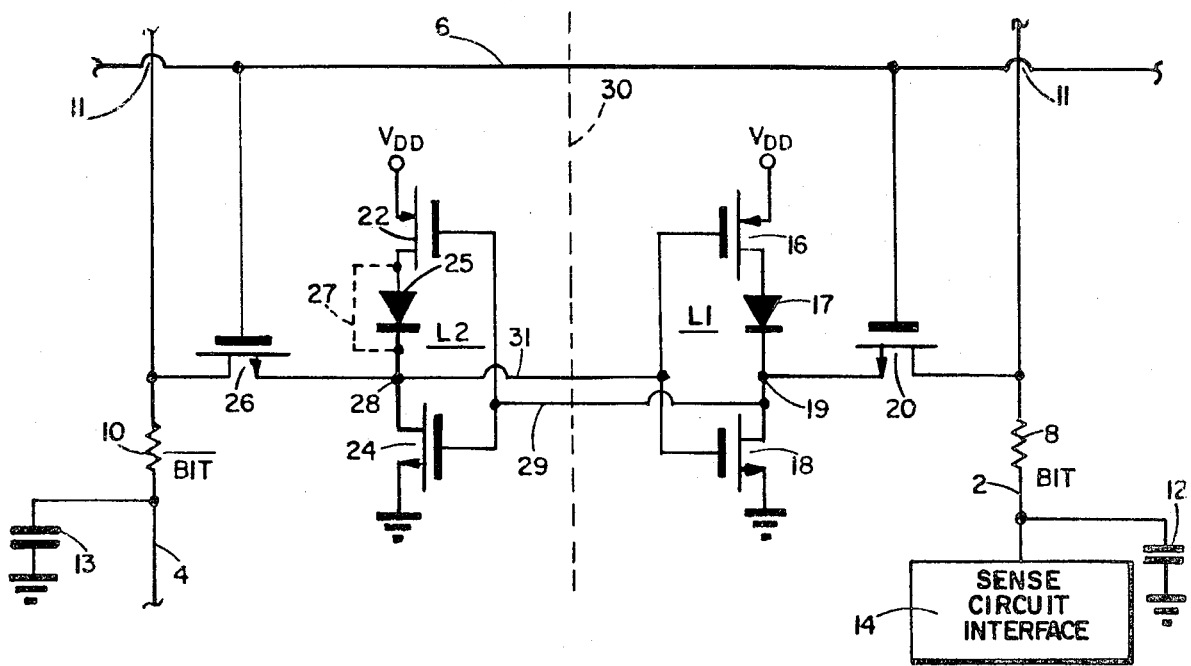
FIG. 1
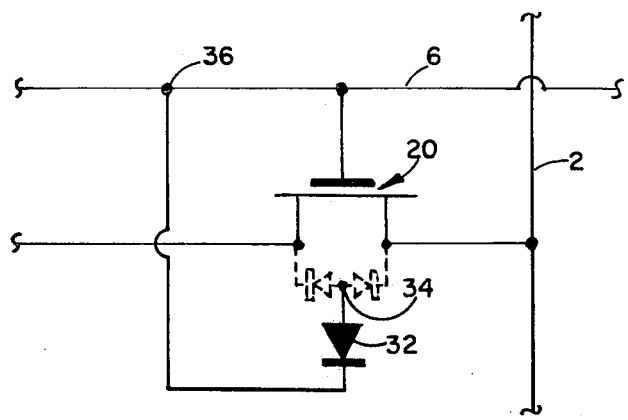
FIG. 2a
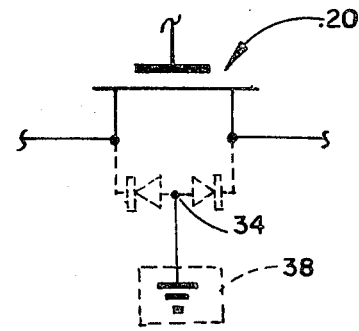
FIG. 2b
| | BIT | $\overline{BIT}$ | ROW SELECT LINE (6) |
|---|---|---|---|
| NO OPERATION | HI | HI | LOW |
| WRITE 0 | LOW | HI | HI |
| WRITE 1 | HI | LOW | HI |
| READ | FOLLOWS STATE OF NODE 19 | FOLLOWS STATE OF NODE 28 | HI |
FIG. 3

HIGH SPEED MEMORY CELL

CROSS-REFERENCE TO RELATED APPLICATION

This application is a continuation-in-part of copending U.S. patent application Ser. No. 513,367, filed Oct. 9, 1974 now abandoned.

BACKGROUND OF THE INVENTION

1. Field of the Invention

This invention relates generally to an improved integrated circuit, very high speed static memory cell which utilizes complementary MOS transistors and silicon on sapphire technology.

2. Description of the Prior Art

A conventional memory cell which has been fabricated from complementary metal oxide simiconductor (CMOS) transistor devices has been known to include, for example, BIT and $\overline{BIT}$ data bus lines, an address line to select from the memory the location of a particular memory cell, and a sense circuit interface including a memory output driver which has utilized both the BIT and $\overline{BIT}$ data buses. Consequently, the conventional memory cell has heretofore been relatively symmetrical in design in order to rapidly discharge either of the BIT or $\overline{BIT}$ input buses. Therefore, transistor devices which are associated with the BIT bus have been chosen to have as wide a channel as those respective transistor devices which are associated with the $\overline{BIT}$ bus. This has resulted in relatively larger inherent capacitances which must first be charged when addressing the cell in order to read out data. Thus, the read operation is undesirably slowed. At the same time, the relatively wide channels of the transistor switches and the design restraints imposed thereby result in increased space requirements and, therefore, increased production costs.

SUMMARY OF THE INVENTION

Briefly, and in general terms, an improved design for an integrated circuit, static memory cell, that may be comprised of metal oxide semiconductor transistors which may be fabricated by means of silicon on sapphire technology, is disclosed. The improved cell may include a normally low voltage row select line to activate the cell at a particular time and first and second data bus lines to carry information to and from the memory cell. Also included is a flip-flop having first and second cross-coupled inverter stages, each stage being comprised of a pair of complementary metal oxide semiconductor field effect transistors. First and second coupling control field effect transistors are also provided. The first coupling field effect transistor is connected between the first flip-flop stage and the first data bus, while the second coupling field effect transistor is connected between the second flip-flop stage and the second data bus.

In accordance with the instant invention, the size of the cell may be reduced and the speed at which data is read out of the cell may be increased by designing the cell to be relatively non-symmetrical. The channel widths of the second coupling field effect transistor and at least one of the pair of field effect transistors which comprises the second flip-flop stage may be chosen to be narrower than the respective channel widths of the first coupling field effect transistor and at least one of the pair of field effect transistors which comprises the first flip-flop stage.

Another embodiment of the instant invention and an alternative means to make a non-symmetrical memory cell is to clamp the body node, which is inherently formed between the source and drain electrodes of the first coupling MOS/SOS field effect transistor, to a supply of relatively low reference voltage, such as the row select line or ground. Clamping the body node of the coupling FET shunts residual leakage current to minimize the capacitance to be discharged from the memory cell and increase the speed by which information is read from the cell.

BRIEF DESCRIPTION OF THE DRAWINGS

FIG. 1 shows a non-symmetrical memory cell which forms the instant invention;

FIGS. 2a and 2b show other embodiments of the memory cell of the instant invention;

FIG. 3 is a truth table describing the operation of the instant memory cell.

DESCRIPTION OF THE PREFERRED EMBODIMENT

Figure 4:
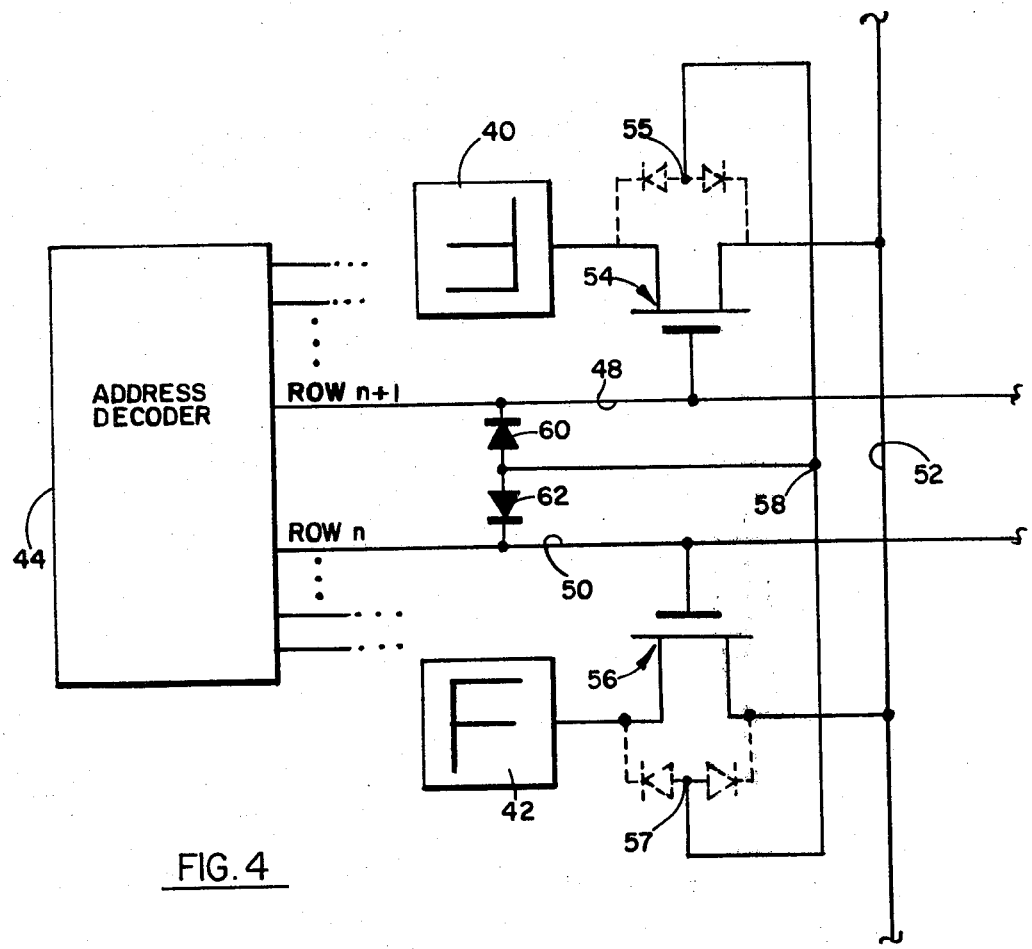
FIG. 4 shows the non-symmetrical memory cell of the instant invention connected in an array thereof.

Relating to the drawings, FIG. 1 shows a single memory cell which may be designed to have both reduced overall size and access time in accordance with the improvements of the instant invention. The cell includes a first data BIT bus line 2, a second data $\overline{BIT}$ bus line 4 and a row select or address line 6. Each data line 2 and 4 is shown with lumped resistances 8 and 10 and lumped capacitors 12 and 13. These (8 and 10 and 12 and 13) represent the distributed effects of resistance and capacitance respectively including that at crossover points 11 between row select line 6 and data bus lines 2 and 4, the output sense circuit (not shown), and the write control circuit (not shown). A logical "0" is written into the memory cell by driving the data BIT bus line 2 to a relatively LOW logic level, and a logical "1" is written into the memory cell by means of data $\overline{BIT}$ bus line 4. Prior art memories have been known to read out information from an array of memory cells by utilizing differential sensing of transients on the data bus lines 2 and 4. Thus, an associated output driver would require both BIT line 2 and $\overline{BIT}$ line 4 inputs. However, the read operation may be enhanced and the memory cell made easier to build by employing an output driver (not shown) and a sensing arrangement interface 14 of the type which would be adapted to measure transients directly from the BIT line 2 alone.

The memory cell includes a pair of cross-coupled inverter stages L1 and L2 forming a bistable device, such as conventional flip-flop. Cross coupled stages L1 and L2 are associated with the BIT line 2 and $\overline{BIT}$ line 4, respectively. Flip-flop stage L1 includes a pair of complementary metal oxide semiconductor (CMOS) field effect transistors (FETs) 16 and 18 which in the preferred embodiment, may be fabricated by well known silicon on sapphire (SOS) techniques. FET 16 is a p-channel device while FET 18 is an n-channel device. The source electrode of FET 16 is connected to a source of supply of voltage $V_{DD}$, which typically may be in the range of 3–15 v. dc. Because of the physical nature of the flip-flop circuit L1, a naturally occurring PN junction, represented by a diode 17, is formed by the drain diffusions of FETs 16 and 18 at the junction betweeen the relatively $P^-$ doped drain region of FET 16 and the relatively $N^-$ doped drain region of complementary FET 18. Thus, the anode of diode 17 is the drain of FET 16 while the cathode of diode 17 is the drain of FET 18. The source electrode of FET 18 is connected to a source of reference potential (e.g. ground). A coupling control field effect transistor 20 having a relatively wide channel width, has a source electrode thereof connected to flip-flop stage L1 at a first data node 19, which is connected at the drain electrode of FET 18. The gate electrode of FET 20 is connected to the row select line 6 to enable the memory cell to be subsequently randomly accessed for data at any particular time. The drain electrode of coupling FET 20 is connected to BIT line 2 so that data stored in flip-flop stage L1 may be selectively read at data node 19 and conducted to the sense circuit interface 14 when FET 20 is rendered conductive by the application of a signal thereto on line 6.

It has heretofore been the practice to design a symmetrical memory cell, i.e. the flip-flop stage L2 could have been folded over the illustrated imaginary dotted line 30 so as to duplicate the design of flip-flop stage L1. An example of a commercially available device which is known to employ a plurality of symmetrical CMOS/SOS memory cells is the model 4200 Random Access Memory, manufactured by Inselek, Inc., Princeton, N.J.

As shown, flip-flop stage L2 comprises a p-channel FET 22 and an n-channel FET 24. As previously described, a naturally occurring diode 25 is formed by drain diffusions at the junction between the relatively $P^-$ doped drain region of FET 22 and the relative $N^-$ doped drain region of FET 24. Also provided is a coupling control field effect transistor 26. FET 26 has a drain electrode thereof connected to the $\overline{BIT}$ line 4, a gate electrode thereof connected to the row select line 6, and a source electrode thereof connected to flip-flop stage L2 at an opposite state (relative to node 19) data node 28.

Because of the symmetrical design of conventional memory cells, it has been known to form the channels of FETs 20 and 26 with the same dimensions, and likewise, the channel dimensions of FETs 16 and 22 and FETs 18 and 24 are the same. Moreover, when reading out a logical 0, the conventional memory cell employs FETs 18 and 20 having relatively low resistances in the conducting or on-mode. Consequently, FETs 18 and 20 have been chosen with relatively wide channel widths in order to discharge the stray capacitance 12 from BIT line 2 so that data can be rapidly read out from the cell. The relatively wider FET channel widths generally increase the overall area of the cell as well as the cost of the integrated circuitry. Since, as previously mentioned, conventional symmetrically designed memory cells are known that utilize an output driver which requires both BIT line 2 and $\overline{BIT}$ line 4 inputs in order that transients may be differentially sensed, the channels of FETs 24 and 26 have been formed as large as those corresponding to FETs 18 and 20. Thus, the overall area and consequent cost has been further increased.

In accordance with the instant invention, a unique non-symmetrical, high speed, static CMOS memory cell has been designed. As a result thereof, information may be more rapidly read out therefrom with fewer design restraints being imposed. The memory cell of the instant invention has a desirable characteristic that it generally occupies a smaller area than that occupied by conventional symmetrical memory cells. As previously disclosed, the memory cell of the instant invention is designed to interface with an output drive (not shown) which would require only one input (BIT bus line 2). Since $\overline{BIT}$ bus line 4 is not utilized for reading in the instant memory cell, FETs 24 and 26 can be chosen to have relatively higher on-resistances, and, consequently, narrower channel widths as compared with their counterpart in the prior art. This has the advantageous effect of decreasing the overall area and cost of the non-symmetrical memory cell.

More particularly, FET 26 is selected to have a higher on-resistance, a higher impedance and a narrower channel width than that of FET 20. The time required to write into the memory cell is also reduced by virtue of the relatively small size of FET 26. The narrow channel width of FET 26 minimizes the capacitance on row select line 6 and on data $\overline{BIT}$ bus 4. By reducing the capacitance on line 6 and bus 4, the time for charging and discharging the cell is accordingly reduced to thereby reduce the time rquired to write data into the cell. FET 24 is chosen with a higher on-resistance, a higher impedance and a narrower channel width than that of FET 18. The channel width of FET 20 is sized narrower than that of FET 18 to prevent the voltage at data node 19 from becoming large enough to initiate a "toggling" effect on the flip-flop. FETs 16, 22, 24 and 26 may be made to have the smallest dimensions and the largest impedances, with a channel width in the order of between 0.2 to 0.3 mils. and a length of approximately 0.2 mils. FET 18 may have the largest channel width, for stability in accpeting large read transient signals, e.g. in the order of 1.0 mils. Coupling control FET 20, which is chosen to determine the speed for performing the read operation by regulating the discharge of capacitance along BIT line 2, has a channel width in the order of approximately 0.6 mils., in the preferred embodiment.

Further asymmetry, when desirable to obtain very rapid discharge of the BIT bus line 2 to ground through FETs 20 and 18 during readout, may be provided by making the width of $\overline{BIT}$ data bus line 4 less than that of BIT data bus line 2. The lumped resistance 10 of $\overline{BIT}$ line 4 may be made greater than the lumped resistance 8 of BIT line 2. Or, the distributed capacitance 13 along $\overline{BIT}$ line 4 may be made greater than the distributed capacitance 12 along BIT line 2.

Both naturally formed diodes 17 and 25 may not be desirable in the memory cell, and it has thus been the practice to short out each diode with a metal strap to eliminate the effects thereof. However, shorting the diodes 17 and 25 with a metal strap increases the area of the cell, since two contacts are needed for each diode to be shorted. As previously disclosed, FET 18 may be chosen to have a lower on-resistance than that of FET 24, so that it would be preferable to have the voltage applied to the gate electrode of FET 18 equal to $V_{DD}$ when FET 22 is turned on. For this reason, diode 25 may be shorted out by a shorting bar 27, shown dotted, while diode 17 may be left as is so as to cause the memory cell to become further asymmetric. When FET 16 is turned on, the voltage applied to the gate electrode of FET 24 is less than $V_{DD}$ by the forward voltage drop of diode 17 which is only about 0.6 volts. Since $V_{DD}$ can be in a range of from 3 to 15 volts, leaving diode 17 unshorted will have negligible effect on the performance of the cell.

Other embodiments to make a non-symmetrical memory cell are shown in FIGS. 2a and 2b. As is uniquely particular to field effect transistors which are fabricated by silicon on sapphire techniques, a body node 34 will exist within the P-region between the source and drain electrodes of the SOS formed n-channel device 20. In FIG. 2a, to preserve the readout speed along BIT line 2, a clamping diode 32 is connected between the body node 34 of coupling control FET 20 and the row select line 6, whereby the body node 34 is clamped at a relatively low voltage. This unique configuration will prevent the body node 34 from becoming positively charged by leakage, which could thereby change the gate capacitance of the coupling field effect transistor 20, as has heretofore been a common occurrence with MOS/SOS devices. A suitable connection 36 to row select line 6, which is normally held at a low voltage level when the memory cell is not being accessed, shunts such leakage current so as to prevent the body node 34 from charging the gate capacitance of those coupling FETs associated with other memory cells not being accessed along BIT bus 2. Therefore, less capacitance will have to be discharged by the selected cell, thereby speeding up the read operation of the instant memory cell.

In the embodiment of FIG. 2b, to prevent the body node 34 of coupling FET 20 from becoming charged by leakage, body node 34 may alternatively be clamped, when convenient, to any other suitable supply of relatively low reference voltage 38. By way of example, body node 34 may be connected directly to ground, as illustrated.

FIG. 3 is a truth table showing possible logic levels of data bus lines 2 and 4 of the memory cell of the instant invention. When the particular memory cell is not operating, data BIT bus line 2 and data $\overline{BIT}$ busline 4 are normally precharged to a relatively HI or true logic level, such as that represented by $V_{DD}$. Row select or address line 6 is normally maintained at a relatively LOW or false logic level, such as that at ground potential. Although not necessary to the understanding of the instant invention, operation of the instant memory cell may be characterized as follows. Briefly, data node 19 represents the state of flip-flop stage L1. If, for example, node 19 is initially at a LOW logic level and it is desired to write a logical 1 into the memory cell, a HI logic level signal is initiated on both the row select line 6 and BIT line 2, while a LOW level signal is initiated on $\overline{BIT}$ line 4. FET 18 will be switched on by the relatively HI logic level voltage ($V_{DD}$). By applying a hard ground to $\overline{BIT}$ line 4, the voltage at the opposite state data node 28 will begin to drop. Consequently, FET 16 will start to conduct and FET 18 will begin to turn off. As FET 18 becomes less able to absorb the amount of current being supplied thereto through FET 20 and FET 16, the voltage on node 19 will increase and the potential thereat will be conducted toward flip-flop stage L2 over line 29. The logic level at opposite state data node 28 will decrease further from a HI to a LOW level and the potential thereat will be conducted toward flip-flop stage L1 over line 31. Thus, by means of a regenerative process, the logic level at data node 19 will become subsequently reversed from a LOW logic level to a HI logic level, and the equivalent of a logical 1 will be written into flip-flop stage L1 at note 19.

FIG. 4 shows another embodiment of the instant invention which includes a means to preserve the readout speed by which information is read from a selected one of an array of information signal source means. Although only two information signal sources 40 and 42 are illustrated, it is to be understood that the instant invention is applicable to a memory array comprised of any suitable number of sources. In a preferred form of the invention, information signal sources 40 and 42 are flip-flops, such as those which have been disclosed with reference to FIG. 1. The information signal source 40 and its adjacent source 42 are each selectively connected to a data bus line 52 via the source-drain conduction path electrodes of coupling field effect transistors 54 and 56, respectively. FETs 54 and 56 are, in the present embodiment, formed from a layer of silicon on a sapphire substrate. The gate electrodes of FETs 54 and 56 are connected to respective row select lines 48 and 50. FET 54 or 56 may be selectively activated by the application of a suitable signal to the gate electrode thereof from a conventional 1 out of n address decoder 44.

As disclosed in greater detail with reference to FIG. 2a, each MOS/SOS field effect transistor 54 and 56 has a respective body node 55 and 57 inherently formed between the source and drain electrodes thereof. The body nodes 55 and 57 of each one of the pair of associated FETs 54 and 56 are connected together at a common electrical junction 58. Junction 58 is electrically isolated from the common electrical junctions which connect together the respective body nodes of other pairs of associated FETs (not shown) where an array of information signal source means and corresponding coupling transistors are employed.

In a preferred embodiment of the instant invention, diode clamping means 60 and 62 are respectively connected between the common junction 58 of body nodes 55 and 57 and a row select line 48 and 50. More particularly the anode electrodes of diode clamping means 60 and 62 are connected together and to common electrical junction 58. The cathode electrodes of diode clamping means 60 and 62 are connected to row select lines 48 and 50, respectively. Although the clamping means of the instant embodiment have been described as diodes, it is to be understood that other suitable unidirectional current conducting means may be utilized therefor. Moreover, and as illustrated in FIG. 2b, the common junction 58 of body nodes 55 and 57 can be clamped to any other suitable supply of relatively low reference voltage (not shown), such as ground.

By virtue of the instant configuration, the body nodes of an associated pair of coupling FETs are clamped at the normally low voltage of the row select lines. Connecting each body node 55 and 57 to a respective row select line 48 and 50 through clamping diodes 60 and 62 shunts residual leakage current. This serves to prevent a body node from becoming positively charged, which could undesirably charge the gate capacitance of those coupling FETs (not shown) associated with other information signal source means of the array not being selectively activated by means of address decoder 44. The body nodes of the coupling FETs comprising the array will be maintained at their steady state level. This assures that only a suitable selection signal being supplied along a row select line will activate a coupling FET and thereby connect its associated signal source means to data bus line 52 in order that information contained therein may be sensed.

By way of example, if a memory array were comprised of n signal sources, the major capacitance loading of bus line 52 could result from $n-1$ coupling FET gate capacitors that would have to be discharged by the selected nth source. The instant invention prevents and n−1 capacitors from becoming charged, thereby eliminating the necessity that they be subsequently discharged. Hence, the speed by which information is read out from the selected signal source means is thereby maximized.

An improved integrated circuit, very high speed, static non-symmetrical memory cell suitably designed for utilizing CMOS/SOS technology has been disclosed. By virtue of the instant improvements, the speed of the read operation is increased. The overall size of the memory cell is decreased accompanied by a corresponding cost savings with improvements in the operation of the cell.

It will be apparent from the foregoing, that while particular forms of the invention have been illustrated and described, various modifications will be made without departing from the true spirit and scope of the instant invention. For example, while the instant memory cell is comprised, in the preferred embodiment, the complementary field effect transistors fabricated from silicon and sapphire techniques, it is to be understood that the transistors may also be fabricated by means of other suitable techniques, such as by self-aligned diffusion and the like.

Having thus set forth a preferred embodiment of the invention, what is claimed is:

1. A memory cell for storing data having an address select line to activate said cell, a first data bus and a second data bus for writing information into said memory cell and for sensing the information stored therein, and including
   first and second cross-coupled inverter means,
   circuit means to connect said first and second cross-coupled inverter means to one another, and
   first and second coupling means,
   said first coupling means connected between said first cross-coupled inverter means and said first data bus,
   said second coupling means connected between said second cross-coupled inverter means and said second data bus,
   said second coupling means and said second cross-coupled inverter means exhibiting greater impedance than said first coupling means and said first cross-coupled inverter means in order to decrease the size and to improve the operating speed of the memory cell.

2. The memory cell recited in claim 1, wherein each of said cross-coupled inverter means comprises a pair of opposite conductivity type semiconductor devices.

3. The memory cell recited in claim 1, wherein each of said cross-coupled inverter means comprises a pair of complementary field effect transistors and each of said coupling means comprises a field effect transistor,
   at least one of said field effect transistors comprising said second cross-coupled inverter means and said field effect transistor comprising said second coupling means having a channel width which is less than the corresponding one of said field effect transistors comprising said first cross-coupled inverter means and said field effect transistor comprising said first coupling means.

4. The memory cell recited in claim 3, wherein each of said field effect transistors has a source, gate, and drain electrode thereof, and is formed from a layer of silicon on a sapphire substrate.

5. The memory cell recited in claim 4, including a clamping diode having a first and a second terminal thereof, the first terminal of said clamping diode connected to the body node formed between said source and said drain electrodes of said first coupling field effect transistors and the second terminal of said clamping diode connected to said address select line.

6. The memory cell recited in claim 1, wherein the resistance of said first data bus is substantially less than the respective resistance of said second data bus.

7. The memory cell recited in claim 1, wherein the width of said second data bus is substantially less than the respective width of said first data bus.

8. The memory cell recited in claim 1, wherein the capacitance along said first data bus is substantially less than the respective capacitance along said second data bus.

9. The memory cell recited in claim 1, wherein each of said first and second cross-coupled inverter means includes a respective diode connected therein having first and second terminals thereof, and
   shorting means connected across the first and the second terminals of one of said diodes.

10. The memory cell recited in claim 3, wherein said field effect transistor comprising said first coupling means has a channel width which is less than the channel width of said corresponding one of said field effect transistors comprising said first cross-coupled inverter means.

11. The memory cell recited in claim 1, wherein said first and second cross-coupled inverter means comprise a flip-flop.

12. The memory cell recited in claim 1, wherein each of said cross-coupled inverter means comprises a pair of complementary field effect transistors and each of said coupling means comprises a field effect transistor,
   the channel width of one of said pair of field effect transistors comprising said first cross-coupled inverter means being narrower than the channel width of said first coupling means field effect transistor, and
   the channel width of said first coupling means field effect transistor being narrower than the channel width of the second of said pair of field effect transistors comprising said first cross-coupled inverter means.

13. The memory cell recited in claim 11, wherein the channel widths of each of said pair of field effect transistors comprising said second cross-coupled inverter means is narrower than the channel width of said first coupling means field effect transistor.

14. The memory cell recited in claim 11, wherein the channel width of said second coupling means field effect transistor is narrower than the corresponding channel width of said first coupling means field effect transistor.

15. In combination:
   terminal means to receive a supply of information signals from a source thereof,
   address select bus line means,
   data bus line means to receive said information signals from said terminal means,
   coupling means to connect said terminal means to said data bus line means,
   said coupling means comprising a multi-terminal semiconductor device,
   first and second conduction path terminals of said coupling means having a body node formed therebetween, said first and second conduction path terminals connected between said terminal means and said data bus line means, a third control terminal of said coupling means having a capacitance associated therewith, said control terminal connected to said address select bus line means in order to selectively activate said coupling means, and means to clamp said body node to a reference source means so as to prevent said body node from becoming charged and thereby charging said capacitance associated with the control terminal of said coupling means, whereby the speed by which information is received by said data bus line means from said terminal means is enhanced.

16. The combination recited in claim 15, wherein said reference source means is said address select bus line means.

17. The combination recited in claim 15, wherein said reference source means is ground.

18. The combination recited in claim 15, wherein said means to clamp said body node includes a unidirectional current conducting means.

19. The combination recited in claim 18, wherein said unidirectional current conducting means is a diode.

20. The combination recited in claim 15, wherein said multi-terminal semiconductor device is a field effect transistor having source, drain and gate terminals corresponding to said first, second and third terminals thereof, said field effect transistor formed from a layer of silicon on a sapphire substrate.

21. A memory array including means to enhance the speed by which information is selectively read from said memory array, said array comprising:
- a plurality of information signal source means,
- data bus line means to read information from said signal source means,
- row select line means to activate selected ones of said information signal source means to be read,
- a plurality of coupling means, each of said coupling means comprising a multi-terminal semiconductor device having a respective conduction path thereof connected between two of said terminals,
- at least one coupling means conduction path selectively connected between each of said plurality of signal source means and said data bus line means,
- each of said coupling means including a body node formed between said conduction path terminals, the body nodes of first and second ones of said coupling means connected together at a common electrical junction, and
- means to clamp said common electrical junction to a reference source means and thereby prevent said body nodes from being charged by leakage current of said respective coupling means.

22. The memory array recited in claim 21, wherein said multiterminal semiconductor coupling means is a field effect transistor formed from a layer of silicon on a sapphire substrate.

23. The memory array recited in claim 21, wherein said means to clamp said common electrical junction includes a unidirectional current conducting means.

24. The memory array recited in claim 21, wherein said means to clamp said common electrical junction includes a diode means having a first terminal thereof connected to said row select line means and a second terminal thereof connected to said common electrical junction.

25. The memory array recited in claim 21, wherein said means to clamp said common electrical junction includes at least one first and second diodes, each of said first and second diodes having a respective first and second terminal thereof, the first of said terminals connected together and to said common electrical junction.

26. The memory array recited in claim 25 wherein said first and second diodes are oppositely poled with respect to one another.

27. The memory array recited in claim 21, wherein said reference source means is said row select line means.

* * * * *